US006516767B1

(12) United States Patent
Maillet et al.

(10) Patent No.: US 6,516,767 B1
(45) Date of Patent: Feb. 11, 2003

(54) METHOD FOR GRADUALLY DRIVING A MOTOR VEHICLE STARTER SWITCH

(75) Inventors: Régis Maillet, Chezeneuve (FR); Gérard Vilou, Tassin la Demi Lune (FR)

(73) Assignee: Valeo Equipements Electriques Moteur, Creteil (FR)

( * ) Notice: Subject to any disclaimer, the term of this patent is extended or adjusted under 35 U.S.C. 154(b) by 15 days.

(21) Appl. No.: 09/763,935

(22) PCT Filed: Jun. 28, 2000

(86) PCT No.: PCT/FR00/01801

§ 371 (c)(1), (2), (4) Date: Feb. 27, 2001

(87) PCT Pub. No.: WO01/02722

PCT Pub. Date: Jan. 11, 2001

(30) Foreign Application Priority Data

Jun. 30, 1999 (FR) ........................................ 99 08368

(51) Int. Cl.[7] ......................... F02N 11/08; H02P 9/04; H01L 21/285

(52) U.S. Cl. .................. 123/179.3; 290/38 A; 318/431

(58) Field of Search ......................... 123/179.1, 179.3; 290/38 R, 38 C, 38 E; 318/430, 431

(56) References Cited

U.S. PATENT DOCUMENTS 4,418,289 A * 11/1983 Mortensen ................ 290/38 R
4,551,630 A * 11/1985 Stahura et al. ........... 123/179.3
4,755,689 A * 7/1988 Porter ...................... 123/179.1
4,916,327 A * 4/1990 Cummins ................. 290/38 R
4,917,410 A * 4/1990 Cummins et al. ......... 290/38 R
5,622,148 A * 4/1997 Xue et al. .............. 123/179.25
5,970,937 A * 10/1999 Casellato et al. ........ 123/179.3
6,104,157 A * 8/2000 Kramer et al. .............. 318/430
6,323,562 B1 * 11/2001 Renner et al. ............ 290/36 R

FOREIGN PATENT DOCUMENTS

| | | |
|---|---|---|
| DE | 4344355 | 7/1994 |
| EP | 0373777 | 6/1990 |
| FR | 2679717 | 1/1993 |

OTHER PUBLICATIONS

Patent Abstract of Japan, Pub No. 57172705, Pub. Date Oct. 23, 1982.

* cited by examiner

*Primary Examiner*—Paul J. Hirsch
*Assistant Examiner*—Arnold Castro
(74) *Attorney, Agent, or Firm*—Liniak, Berenato & White

(57) ABSTRACT

The invention relates to a method for energising a coil for driving a moving contactor core of an electric starter for a motor vehicle, in which the effective current is varied in the coil during displacement of the core to its contact position, and in which, in the course of this displacement, there take place:

a first driving phase with an effective current which is high enough to set the core in motion, and then a second driving phase with a smaller effective current, in which, after a determined or predetermined time, the effective current is continuously increased.

10 Claims, 2 Drawing Sheets

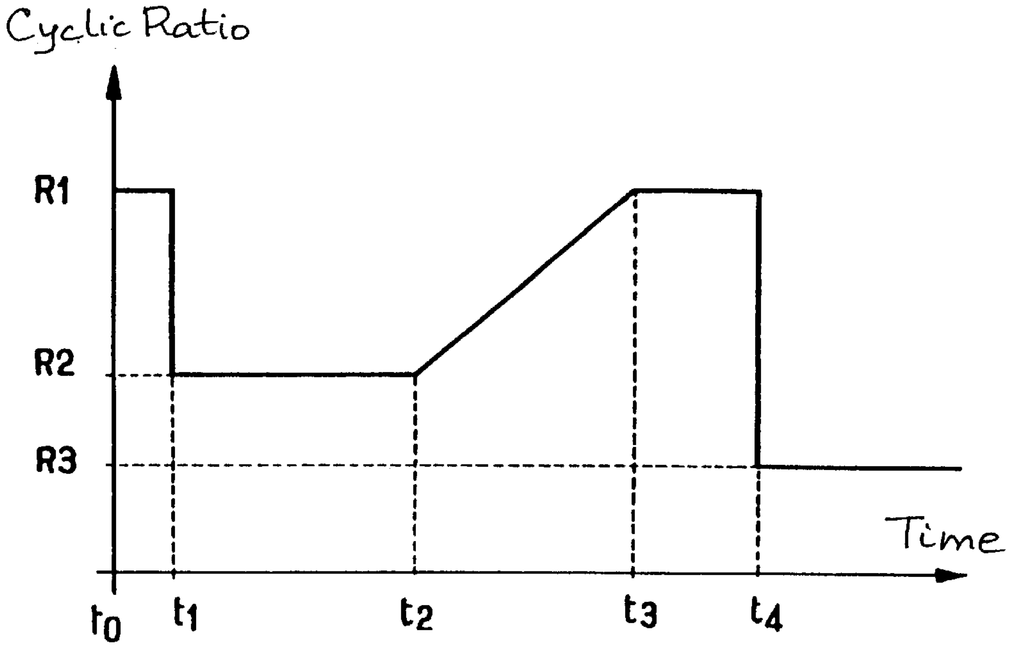
FIG4
FIG.3
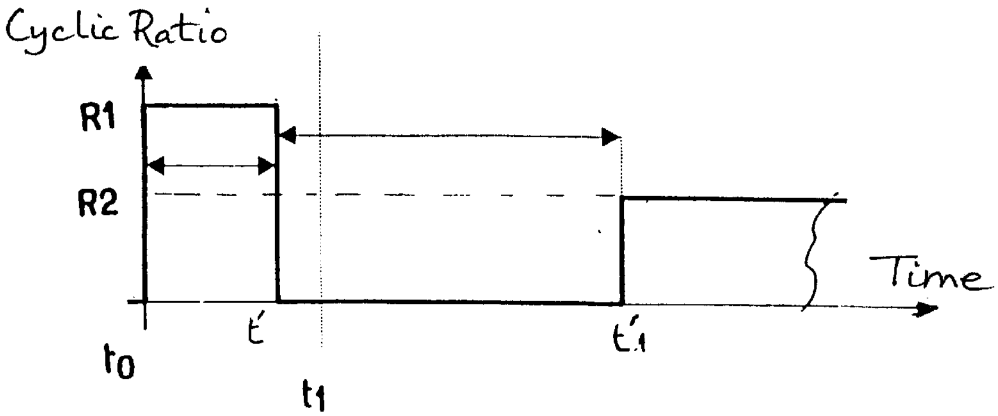

METHOD FOR GRADUALLY DRIVING A MOTOR VEHICLE STARTER SWITCH

The present invention relates to methods and apparatus for controlling starters of motor vehicles, and more precisely to methods and apparatus for driving the core of the contactor of the said starters.

As is shown in FIG. 1, a motor vehicle starter conventionally comprises a contactor 2 and an electric motor M, the output shaft of which carries a pinion 1. The pinion 1 is adapted to come into meshing cooperation with the starter crown C of the heat engine. It slides on the motor shaft M between a position in which it is disengaged from the said starter crown and a position in which it meshes with the latter.

The contactor 2 extends parallel to the electric motor M, above the latter, and includes a coil 2*a* and a plunger core 2*b*.

It controls the power supply of the electric motor M by displacement of a moving contact 3 between an open position and a closed position, the said contact 3 being pushed by the said plunger crown 2*b,* which is movable axially with respect to the electric motor M when the coil 2*a* is energised.

The contactor 2 also controls displacement of the pinion 1. Its plunger core 2*b* is, for that purpose, connected to the pinion 1 by mechanical means indicated as a whole by the reference numeral 4.

These mechanical means include a fork which is attached at its upper end to the plunger core 2*b* and at its lower end to a starter head of which the pinion 1 is a part.

The starter head includes a free wheel which is interposed axially between a hub and the pinion 1. The hub has internal helical splines which engage with complementary external helical teeth carried locally by the output shaft of the electric motor M.

The fork is mounted for pivoting movement between its two ends on a casing which contains the mechanical means 4 inside it, and which carries the motor M and the contactor 2. The starter head with its pinion 1 is set in helical motion when it is displaced by the fork so as to engage with the starter crown.

This is achieved by energising the coil 2*a* following action by the ignition key which sets the plunger core 2*b* in motion, so that it is drawn towards a fixed core. mounted at the end of a support of the coil 2*a*. This support has a U-shaped cross section in order to contain the coil 2*a*, and accordingly has a base which constitutes a bearing 2*c*. The core 2*b* is therefore arranged to be displaced between a rest position and a contact position, in which it is in engagement on the fixed core, this closed position of the magnetic circuit being reached after the moving contact 3, and therefore the electrical circuit, are closed.

The mechanical means also include a return spring mounted around the core 2*b* so as to return the latter to its rest position, a cut-off spring associated with the moving contact 3 to return the latter to its open position, and a spring 5, called a clamping spring, which is mounted within the core 2*b* and is in engagement with a first rod coupled by a pivot pin to the upper end of the fork, for attaching the latter to the core 2*b*. This spring 5 has a higher stiffness than the return spring.

The fork is therefore interposed at its upper end between the core 2*b* and the pivot pin. The first rod, which is mounted within a blind hole in the core 2*b,* is arranged so that, after a predetermined course of travel, it comes into engagement with a second. rod fixed to the moving contact 3 and mounted for sliding movement within the fixed core. In the position where the contact 3 is closed, it cooperates with a fixed contact in the form of pads which are connected, respectively, to the positive terminal of the battery and to the electric motor M, thereby providing the power supply for the electric motor.

The pads are fixed to the closure cap of the contact, which is of insulating material.

All of these elements are shown in FIG. 1 and, in the interests of simplicity, have not been given reference numerals.

The pinion 1 is therefore able to come into engagement with the crown C, that is to say it can come into meshing engagement with the crown C before the moving contact has been closed.

Usually, the pinion 1 comes into axial abutting contact with teeth of the crown C before penetrating into the latter.

Thus, the mechanical means 4 include, in particular, a spring 5 which is interposed mechanically between the plunger core 2*b* and the pinion 1, and which enables the plunger core 2*b* to continue its course of travel whereby to ensure, before it makes contact with the fixed core, that the moving contact is put into its closed position even if the pinion 1 is prevented from moving by abutment against the teeth of the crown of the heat engine, in a position in which it is not meshing with the said crown.

Nevertheless, having regard to the rapidity of the movement of the moving core 2*b* and the elasticity of the mechanical coupling means 4, due in particular to the presence of the spring 5, substantial dephasing may occur between the closing of the contact 3 and the axial displacement of the pinion 1. Particularly at low temperatures, rotation of the electric motor, and therefore of the pinion 1, can be found to occur before the latter has had time to penetrate into the crown. Because the electric motor M is supplied at full voltage, the speed of the pinion 1 increases very fast, thereby preventing the pinion from meshing in the crown. The result is rapid destruction of crown and pinion.

In the document FR-A-2 679 717, it has been proposed to mitigate this disadvantage by supplying the contactor with a variable pulsed current.

With reference to FIG. 2, in this type of arrangement, a coil B controls both a contactor K and the forward displacement of a pinion, not shown. The coil B is supplied through a transistor T in pulse mode, of the pulse width modulation (PWM) type, the transistor being governed by a microcontroller 10. A cyclic ratio of the pulses is increased progressively so as to obtain an effective current in the coil which increases progressively. The purpose of this is to enable the moving core to begin its displacement with a minimum of magnetic attraction force and therefore with minimum acceleration, in order to avoid dephasing between the movement of the core and that of the pinion as described above.

This method also aims to reduce the velocity of impact of the pinion against the crown, whereby to reduce frontal wear in the latter.

However, it does not prevent violent displacement of the core from its rest position towards its working position.

In order to obtain a further reduction in this impact velocity, a method was proposed in the document U.S. Pat. No. 4,418,289, which conforms with the preamble to Claim 1, for supplying power to a coil for actuating a moving core of a contactor for an electric starter for a motor vehicle, wherein the effective current is varied in the coil during displacement of the core towards its contact position, and wherein, during this displacement, there take place:

- a first driving phase at a high enough effective current to set the core in motion, and then, a second driving phase with a weaker effective current.

The said document also proposes apparatus for control of the power supply to a coil for driving a moving contact of a motor vehicle starter, arranged to vary the effective current in the coil during displacement of the core towards its contact position, wherein it is arranged to perform, in the course of this displacement:

a first driving phase at an effective current sufficient to set the core in motion, then:

a second driving phase at a lower effective current.

In practice, it is arranged that, during the second phase, the electric motor is energised so that it rotates at reduced speed due to a supplementary disc having supplementary contacts and a supplementary resistor which are incorporated in the contactor. This second phase terminates on closing of the moving contact, which then cooperates with the fixed contact to energise the electric motor at full power.

This solution is not entirely satisfactory because it complicates the construction of the contactor.

In addition, it is not entirely reliable because, for example, the starter head and therefore the pinion can be prevented from moving.

An object of the present invention is to overcome these disadvantages in a simple and inexpensive way.

According to the invention, a method of the type mentioned above is characterised in that, during the second phase, when the moving core is not in its contact position, after a predetermined or determined time, a continuous increase in the effective current is initiated.

According to the invention, an apparatus of the type described above is characterised in that a continuous increase in the effective current is initiated during the said second phase after a predetermined or determined time.

Thanks to the invention, the contactor is of a simple form, and violent displacement of the core from its rest position to its working position is avoided.

In this connection, the effective current in the first time period of the second phase is less than the starting current in the solution in the document FR-A-2 679 717, because the core has already been released. Thus, noise is reduced and the solution is reliable.

In that connection, after a determined or predetermined time, the progressive increase of the effective current first enables the clamping spring 5 to be compressed, and secondly enables the contactor to close so as to energise the electric motor in the accidental case in which the contactor has been unable to be already closed.

Thus, in the accidental case where abnormally high friction forces occur in the contactor, in the mechanical means or in the region of the shaft of the electric motor, closing of the contactor is ensured after a predetermined or determined time.

Such cases can produce jamming as a result of particular climatic conditions, especially when the vehicle has been stationary for a long time. Dust and dirt can be lodged in the region of the fork and the shaft of the electric motor, and can therefore hinder displacement of the pinion.

The invention does nevertheless enable the starter head and its pinion to be displaced.

In addition, the pinion comes into abutting contact with the starter crown, either before the current is increased or after the current is increased and therefore the moving contact is closed, so that the electric motor is started from zero speed in this abutting contact position, which facilitates penetration of the pinion into the crown while reducing wear accordingly.

The solution according to the invention is therefore reliable and enables the useful life of the starter to be increased, in particular due to a reduction in wear.

Moreover, energy consumption and noise are reduced. The solution is inexpensive because the contactor can have only a single coil.

The invention makes it possible to carry out measurements during the first phase. This first phase can be divided into two time periods, namely a first time period in which the effective current is high, followed by a second period at a current lower than that in the second phase.

The second time period is preferably performed at zero current, so as to give the best measuring accuracy.

It is thus possible to measure the voltage in the battery during the first phase. During this first phase, the core is able to become unstuck after a shorter course of travel, the current during the first time period of this first phase being close to the current needed to cause the core to be so released, the phase being carried out with a shorter time period.

If some problems arise as a result, for example failure of the core to be released and failure of the contactor to close, these problems will be reduced in accordance with the invention because of the continuous increase in effective current intensity.

The limited release of the core enables shocks and violent displacements to be reduced even further, and also reduces energy consumption.

Thanks to the invention, the core has a double function, because, after a third time period in the second phase during which the intensity of the effective current is increased, it enables the moving contact to be held closed during a third phase after the electric motor has been started.

It will be appreciated that the electric motor only rotates after the pinion has come into engagement with the crown, so that the pinion is more easily able to penetrate into the crown, and so that wear is reduced.

The invention makes it possible to be at the limit of unsticking or release of the core in the first phase, so that the movement of the core is even more gentle.

The time is determined as a function of abnormal values which occur in the event of non-closure of the moving contact.

The time is determined for example as a function of the voltage in the battery or the temperature of the coil.

The time is easily determined in such a way that the continuous increase of current only takes place when required, that is to say the time can be made as short as possible, and this will embrace the majority of normal operating situations.

Further features, objects and advantages of the invention will appear on a reading of the following detailed description, which is made with reference to the attached drawings in which:

FIG. 3 is a graph showing the variation with time of a cyclic ratio of power supply voltage in a contactor coil, in accordance with the invention;

FIG. 4 is a partial view similar to FIG. 3, showing another embodiment.

Figure 1:
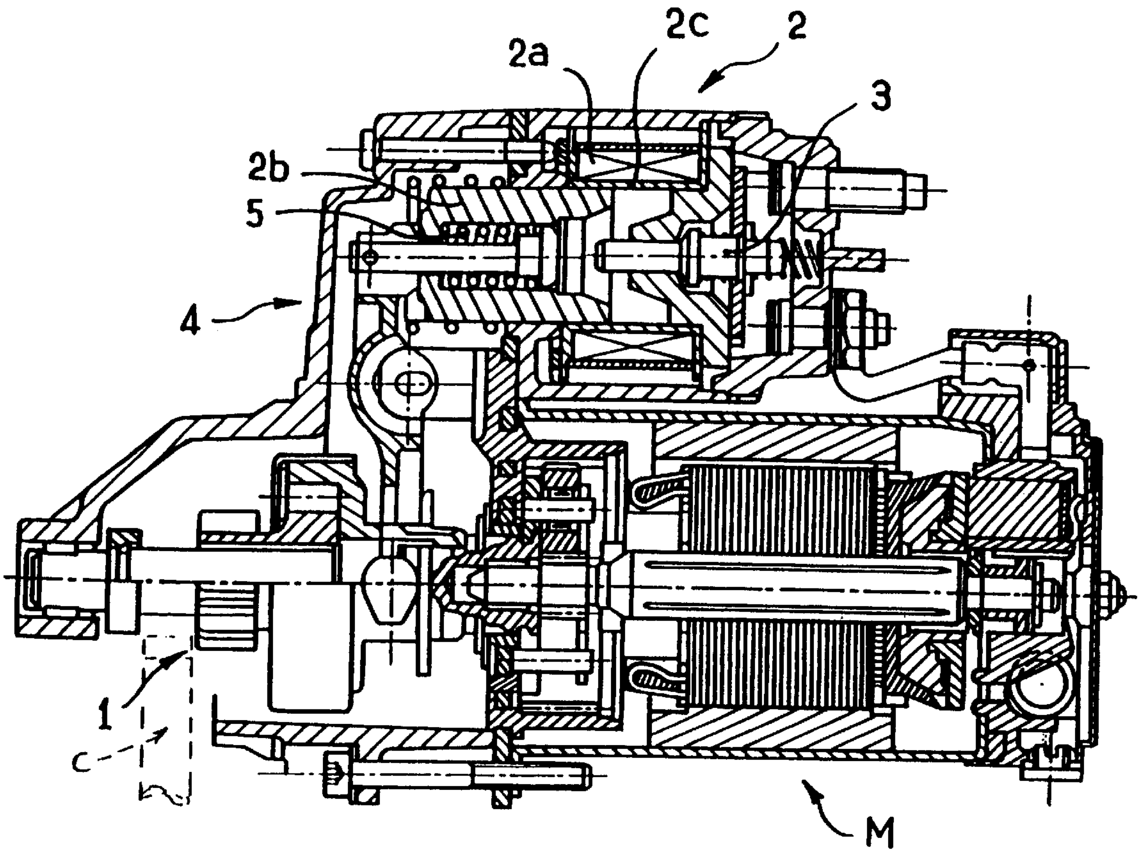
FIG. 1 shows a motor vehicle starter in the state of the art.
Figure 2:
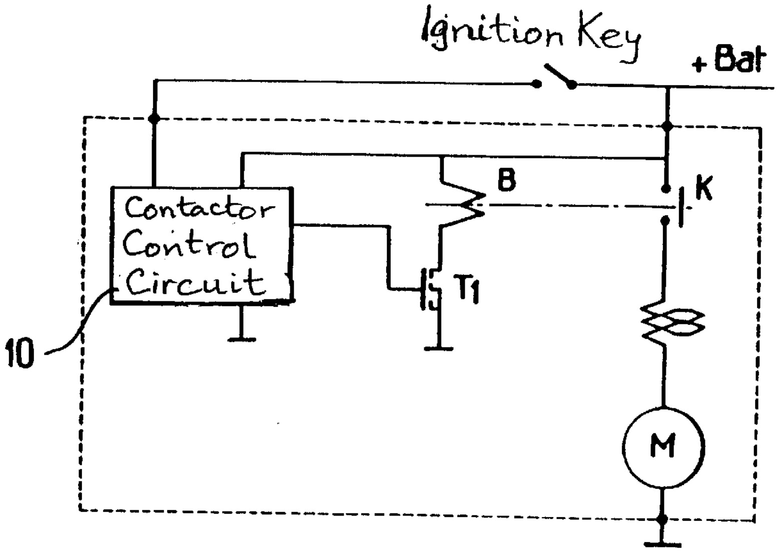
FIG. 2 shows a power supply circuit for a starter contactor in the state of the art.

As shown in FIG. 1, the plunger core **2*b* is disposed in the bearing 2*c* in a sliding arrangement which is modified by the presence of a lubricant which has both a sealing and a braking function. The core 2*b*** is therefore a moving core.

In its rest position, the core exerts an adhesive force Fa on the bearing, which opposes the setting in motion of the core. When the core is released, and so set in motion, this force Fa disappears in favour of a friction force Ff which is generally smaller than Fa (of the order of 20 to 40% less).

The presence of the lubricant does not eliminate these forces. On the contrary, by a gumming effect in the lubricant, the latter accentuates further the fact that the adhesive force Fa exceeds the friction force Ff. The moving core 2*b* remains in its rest position, so long as the coil 2*a* is not exerting an attractive motor force Fm which is greater than Fa.

During setting of the core 2*b* in motion, the effective current intensity is increased progressively in the coil 2*a*. The forces of retention of the core diminish sharply (from Fa to Ff) as the core is set in motion, while the attractive force Fm will have already attained a high value when the core starts. This difference between Fm and Ff accordingly induces, at the instant when the core starts to move, a sharp acceleration of the moving core such that the progressive power supply does not produce the desired effects.

Here, use is made of a power supply apparatus for the coil 2*a*, the arrangement of which remains similar to that shown in FIG. 1, and in which, again, the coil 2*a* is energised at a peak voltage of the PWM type.

However, the cyclic ratio is caused to vary during the displacement of the core, in accordance with the relationship shown in FIG. 3, after a predetermined or determined time.

In that graph, the abscissa shows successive instants in the course of the displacement of the core, from its initial rest position (at the instant $T_0$) to a final position (i.e. the "core call-up period"), where it is in abutment against the fixed core and where it ensures contact, the moving contact 3 then being closed.

The call-up period for the core is divided into two main phases, the second of which is divided into three sub-phases. These two main phases will now be described.

During the first phase, which goes from the instant $t_0$ to an instant $t_1$, a cyclic ratio R1 is adopted which is close to, or equal to 100% (the cyclic ratio is the ratio between the conduction time of the transistor $T_1$ and the total duration of a cycle). During this phase a high effective current goes through the coil 2*a*, and the core 2*b* is subjected to an attractive force Fm which is sufficient to release it from its rest position and to set it in motion. This phase is brief, in being in this example of the order of 2 to 10 ms, so as to produce a high force of attraction on the core only with a view to unsticking the latter.

The second phase runs between the instant $t_1$ and an instant $t_3$. In a first period of this second phase, the transistor $T_1$ controls the contactor according to a cyclic ratio having a value R2 which is substantially equal to 50%, so that the effective current in the coil 2*a* is substantially reduced as compared with that which is obtained during the first phase, to be just enough to overcome the residual friction force Ff after the core 2*b* has been released. During this period, which lasts about 30 to 60 ms, the core 2*b* then pursues its displacement until the contactor closes, gently and without excessive speed. During this first period of the second phase, in the general case, axial abutting contact is obtained between the pinion 1 and the starter crown, between time $t_1$ and time $t_2$.

More precisely, the microcontroller 10 is connected through one of its inputs to a temperature sensor located inside the contactor 2*a*, close to the coil 2*b*, and is also connected through a second input to the power supply terminals of the starter.

The microcontroller 10 receives on its two inputs signals which represent the temperature T of the contactor, and therefore that of the coil 2*a*, and the supply voltage U at the input of the starter.

The supply voltage of the starter is variable as a function of the state of charge of the battery of the vehicle and as a function of temperature. In this connection, the temperature of the coil 2*a* directly affects its resistance. Now, the mean current obtained by a given cyclic ratio depends directly on the voltage available at the terminals of the starter—and therefore across the battery terminals—and on the resistance of the coil 2*a*.

The microcontroller 10 therefore includes a memory in which a digital table is recorded which represents the correspondence, for a desired effective current intensity, of the cyclic ratio R2 to be adopted as a function of the supply voltage of the starter and the temperature of the coil. In practice, R2 is of the order of 0.4 to 0.6 at a temperature of 20°.

The effective current intensity is substantially constant during the first time period.

Thus, the microcontroller 10 automatically adopts a cyclic ratio R2 as a function of the supply voltage at the terminals of the starter and as a function of the resistance of the coil (which itself depends on temperature). The measurements of voltage U and temperature T are preferably taken before the first phase described above is started, at the instant of actuation of the starter.

In a second time period of the second phase which runs from the instant $t_2$ to the instant $t_3$, and in accordance with the invention, after a predetermined time, or, in another version, in a determined time, the microcontroller 10 commences a continuous and progressive increase in the cyclic ratio from the ratio R2 until it reaches the ratio R1, or in another version a ratio greater than R1. This time interval has a duration of about 20 to 50 ms, and, by virtue of the progressive increase in the effective current, it ensures that the contactor closes, in an accidental case in which the contactor has been unable to be closed between time $t_1$ and time $t_2$. Such an accidental case may happen, in particular, if abnormally high friction forces occur in the contactor, in the mechanical means 4 and in the region of the shaft of the motor M. These anomalous forces are due for example to the effects of weather, expansion, jamming, the presence of dirt, and any other contaminants, in particular in the region of the splines of the electric motor shaft and the articulations of the fork.

During this second time period, the spring 5 is fully compressed so as to enable the plunger core 2*b* to actuate the moving contact 3 whereby to energise the electric motor and cause its shaft to rotate, thereby ensuring that the pinion enters into the crown and that the pinion meshes with the crown.

In the case where the moving contact is closed between time $t_1$ and time $t_2$, with the pinion meshing with the crown C, there is of course no need to increase the current continuously, because meshing engagement is obtained before lapse of a time period which is predetermined according to the application. In 90% of cases, the moving contact is closed before this predetermined time which is the shortest possible time to enable normal functions to take place.

In another version, this time is determined, for example as a function of the voltage of the battery or the temperature of the coil 2*a*, these quantities being influenced by non-closure. of the moving contact giving rise to abnormal values.

In all cases, in an additional time period running, in FIG. 3, between the instant $t_3$ and an instant $t_4$, the cyclic ratio is maintained at R1 or a value greater than R1 for about 5 to 30 ms. This high cyclic ratio phase starts on closing of the moving contact 3 and maintains the core 2*b* in its contact position (so that the moving contact 3 is closed) with a high attractive force which prevents the moving core 2*b* bouncing on an abutment which is conventionally defined by another core which is fixed. This third time period from $t_3$ to $t_4$ lasts long enough to be able to absorb the points of current due to starting of the heat engine by the electric motor M, which, according to a feature of the invention, is ungoverned.

According to a feature, it is only after the crown has been brought into engagement with the pinion that the cyclic ratio is increased.

After the third time period, in a third phase, a cyclic ratio R3 is adopted across the resistance of the coil 2*a*, in order to maintain the moving contact in its closed position.

The effective current is smaller in this third phase than in the other two phases.

As will have been understood and as will emerge from the description, a single coil 2*a* is necessary and the microcontroller can be mounted on a support such as a circuit board in the starter, and more precisely it can be mounted close to the coil 2*a* in the space defined between the moving contact 3 and the cap (not shown in FIG. 1) which carries the fixed contacts.

Thanks to the invention, and thanks to the pulse width modulation during the first phase, and more precisely at the start of the latter, it is possible to take a current measurement and therefore a voltage measurement of the battery, given that, as described above, the mean current obtained for a given cyclic ratio is directly dependent on the voltage available across the battery.

Using the digital table recorded in the microcomputer 10, the desired cyclic ratio is adopted after the beginning of the first time period of the first phase.

Thus, in FIG. 4, the first phase is divided into two periods $t_0$–t' and t'–$t'_1$.

In the first time period, the cyclic ratio R'1 is 100%. In the second time period, the cyclic ratio is less than the cyclic ratio R2.

Preferably, in FIG. 4, the cyclic ratio in the second period of the first phase is zero so that the measurement is more accurate. In practice, the effective current during the first period of the first phase is lower than that in FIG. 3, though still close to it. This effective current is therefore higher than that of the second phase where the cyclic ratio is R2.

The duration t' of the first period is shorter than the duration $t_1$.

The duration t'–$t'_1$ of the second period is longer than the duration t' of the first period. This duration is in this example more than double that of the first period, and enables a good measurement to be taken before the second phase begins.

For example, if $t_1$ is 4 ms, the time t' is 3 ms and the length of the second time period $t'_1$–t' is 7 ms.

The current at the end of phase 1 is about 3 A less than that in FIG. 3.

In FIG. 4, displacement of the core in phase 1 is less than half that in FIG. 1.

With the ratio R', the system is close to the limit for unsticking the hub. In FIG. 4, the other time periods in the second and third phases have of course not been shown, in the interests of simplicity.

The apparatus and method proposed here accordingly enable the progressivity of the movement of the moving core 2*b* and pinion 1 to be optimised. In this way, the useful life of the pinion 1 and the driving crown are increased, while a significant reduction is obtained in the noise set up by impact of the pinion against the crown.

Even if the core is not released during the first two phases, it can be caused to be released. The electric motor current is not governed.

The solution is simple, reliable and inexpensive.

In FIG. 3, it is of course possible to reduce the effective current intensity during the first phase. It all depends on the displacement of the plunger core which it is desired to have. In contrast with the prior art, the release limit of the core can be approached to the closest possible extent, and the displacement of the latter can be better controlled, in particular by adjustment of the duration of the first phase. In the prior art, a larger safety factor must be provided in order to be certain that the core will unstick.

Thanks to the invention, unsticking of the core is less violent and it is also better controlled, with the first time period of the second phase taking place at substantially constant effective current.

As will have been understood, by locating the microcontroller 10 on a circuit board, as mentioned above, in the vicinity of the coil 2*a*, the temperature of the latter can be measured by mounting on the circuit board a resistor connected to the microcontroller and variable with temperature, for example one having a positive or negative temperature coefficient.

What is claimed is:

1. Apparatus for control of the power supply to a coil (B) for driving a moving contact (2*b*) of a motor vehicle starter, arranged to vary the effective current in the coil (B) during displacement of the core (2*b*) towards its contact position, whereby to close a moving contact (3) of the contactor and to energise the electric motor, wherein it is arranged to perform, in the course of this displacement:

- a first driving phase ($t_0$, $t_1$) at an effective current sufficient to set the core in motion, then:
- a second driving phase ($t_1$, $t_2$, $t_3$) at a lower effective current, characterised in that a continuous increase in the effective current is initiated during the said second phase after a predetermined or determined time.

2. Apparatus according to claim 1, characterised in that it includes means for measuring a supply voltage of the starter and means to vary the level of the effective current as a function of the said voltage during the second phase ($t_1$, $t_2$, $t_3$).

3. Apparatus according to claim 2, characterised in that it includes means for measuring a resistance of the coil (B) and for varying the effective current as a function of the said resistance during the second phase ($t_1$, $t_2$, $t_3$).

4. Apparatus according to claim 7, characterised in that it includes means for measuring the temperature and means for varying the effective current as a function of the said temperature during the second phase ($t_1$, $t_2$, $t_3$).

5. Apparatus according to claim 8, characterised in that it is arranged that the coil (B) be supplied with a pulsed voltage, the cyclic ratio (R1, R2) of which is different in the first phase ($t_0$, $t_1$,) and in the second phase ($t_1$, $t_2$, $t_3$).

6. Apparatus according to claim 9 characterised in that it includes means (10) for deducing the cyclic ratio (R2) of the power supply of the coil (B) as a function of the result or results supplied by the measuring means.

7. A method of supplying power to a coil (B) for actuating a moving core (2*b*) of a contactor (2) for an electric starter for a motor vehicle, having an electric motor (M), wherein the effective current is varied in the coil (B) during displacement of the core (2*b*) towards its contact position, whereby to close a moving contact (3) and energise the electric motor (M), and wherein, during this displacement, there take place:

- a first driving phase ($t_0$, $t_1$) at a high enough effective current to set the core (2*b*) in motion, and then,
- a second driving phase ($t_1$, $t_2$, $t_3$) with a weaker effective current, characterised in that, during the second phase ($t_1$, $t_2$, $t_3$), after a predetermined or determined time, a continuous increase in the effective current is initiated.

8. A method according to claim 7, characterised in that the effective current during the second phase ($t_1$, $t_2$, $t_3$) is of the order of 0.4 to 0.6 times that which is applied during the first phase ($t_0$, $t_1$).

9. A method according to claim 8, characterised in that the first phase comprises a first period with an effective current which is high enough to set the core (2*b*) in motion and a second period at a lower effective current than that of the first phase, or is even zero.

10. A method according to claim 9, characterised in that a high current phase ($t_3$, $t_4$) is performed after the moving contact (3) has closed.

* * * * *